United States Patent [19]

Kort et al.

[11] 4,371,951
[45] Feb. 1, 1983

[54] APPARATUS FOR CONVERTING SERIAL INPUT SPARSE VECTOR FORMAT TO PARALLEL UNPACKED FORMAT FOR INPUT TO TANDEM ARITHMETIC LOGIC UNITS

[75] Inventors: Raymond C. Kort, New Brighton; James W. Kelley, Stacy, both of Minn.

[73] Assignee: Control Data Corporation, Minneapolis, Minn.

[21] Appl. No.: 191,808

[22] Filed: Sep. 29, 1980

[51] Int. Cl.³ ............................................. G06F 5/04
[52] U.S. Cl. ............................................. 364/900
[58] Field of Search ... 364/200 MS File, 900MS File, 364/736

[56] References Cited

U.S. PATENT DOCUMENTS 3,919,534 11/1975 Hutson et al. .................. 364/900
4,128,880 12/1978 Cray, Jr. ........................ 364/200
4,162,534 7/1979 Barnes ........................... 364/900
4,172,287 10/1979 Kawabe et al. ............... 364/200 X Primary Examiner—Raulfe B. Zache
Attorney, Agent, or Firm—Edward P. Heller; Joseph A. Genovese

[57] ABSTRACT

Apparatus is disclosed for processing sparse vectors in a tandem or parallel processing environment. Sparce vectors are those vectors stored in memory with their zero-valued operands deleted. They have a corresponding order vector of bits whose state indicates the order of zero and non zero operands in a corresponding expanded vector. The apparatus fetches the order vectors n bits at a time, n corresponding to the number of tandem processors, and counts the number of one bits. This number of operands is then fetched from memory. The apparatus aligns and orders the fetched sparse vector operands, inserts zero operands where appropriate, and forwards the resulting portion of the expanded vector to the tandem processors for processing.

4 Claims, 2 Drawing Figures

to A_n.

APPARATUS FOR CONVERTING SERIAL INPUT SPARSE VECTOR FORMAT TO PARALLEL UNPACKED FORMAT FOR INPUT TO TANDEM ARITHMETIC LOGIC UNITS

BACKGROUND OF THE INVENTION

1. Field of the Invention

The present invention relates to the field of data processing and more particularly to central processing units.

2. Brief Description of the Prior Art

Sparse vectors are multi-operand vectors having zero or near zero operands removed and the remaining operands packed together. An apparatus for processing such vectors by a computer's central processing unit is disclosed in U.S. Pat. No. 3,919,534 to Hutson, et al. Such apparatus forwards operands to the arithmetic logic unit (ALU) from a given sparse vector one at a time. Zero operands are provided to the ALU only when a second sparse vector being input to the ALU for coprocessing has a non-zero operand in that order. An order vector is provided for each sparse vector to indicate by the state of a bit whether the correspondingly ordered sparse vector operand is zero or non-zero.

SUMMARY OF THE INVENTION

The present invention converts sparse vector format into unpacked format and forwards n-operands at a time to an n-wide arithmetic logic unit for tandem processing. In this manner, overall processing speed may be increased up to n times.

Unpacking is performed by inspecting the corresponding order vector n bits at a time. Operands are taken from the head of the sparse vector and positioned for each one-bit in the order vector. Zeros or a preselected operand value are inserted for each zero-bit in the order vector. A one-bit population count is performed on the n-bit segment of the order vector to control the moving of the sparse vector operands forward according to the count.

Selectively substituting all one-bits for the order vector at predetermined points in the logic allows the apparatus to expand a sparse vector into an expanded vector and/or compress a vector into a sparse vector.

DESCRIPTION OF THE PREFERRED EMBODIMENT

Figure 1:
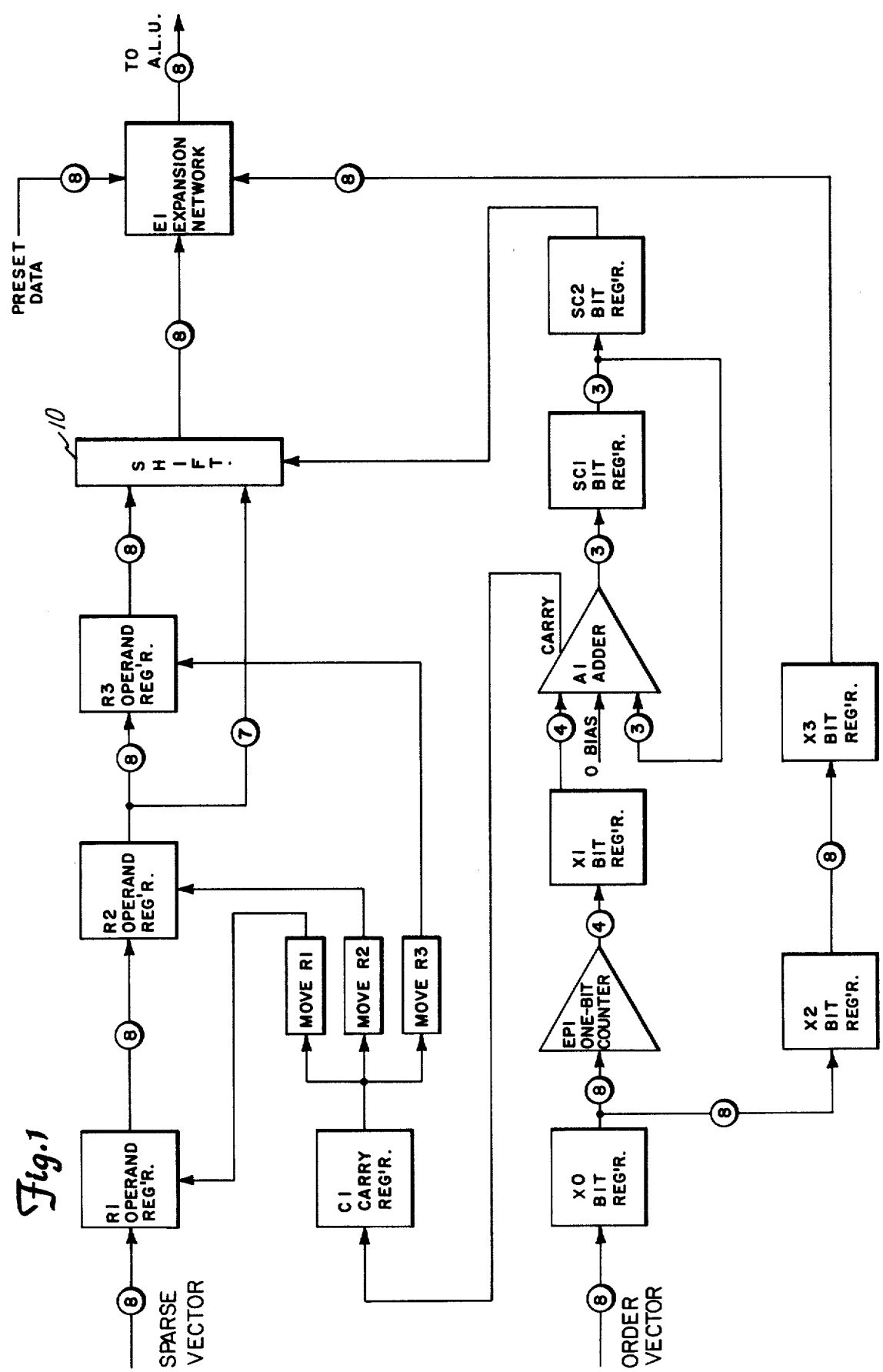
FIG. 1 shows a schematic of a circuit to expand a sparse vector for tandem procession by an ALU.

FIG. 1 shows a schematic of the apparatus for unpacking a sparse vector for subsequent processing by an arithmetic logic unit (ALU). Normally, the ALU will coprocess two vectors at a time: adding, subtracting, multiplying or dividing them. The apparatus shown in FIG. 1 unpacks only one such vector. For processing two vectors, the apparatus of FIG. 1 is duplicated.

A typical vector has a number of operands in a specific order such as $A_0, A_1, A_2, A_3 \ldots, A_n$. A sparse vector is a vector having certain predetermined operand values deleted. Normally, operands having a value of 0 or near 0 are deleted. The remaining operands are concatenated or packed for more efficient storage in memory and retrieval therefrom. For example, assume operands $A_2$, $A_3$ and $A_8$ of a given vector have the value of zero. That vector's sparse vector would appear in memory as $A_1, A_4, A_5, A_6, A_7, A_9, \ldots$ to $A_n$.

When performing an arithmetic operation with vectors, the corresponding order of operands of each vector must normally be simultaneously input to the ALU for processing. For example, when adding vector A to vector B, the corresponding order operands must be added, e.g., $A_1+B_1, A_2+B_2, A_3+B_3, \ldots A_n+B_n$.

As the sparse vectors located in memory do not have any inherent alignment information, i.e., the counting of five operands in from the first operand does not indicate operand $A_4$, each sparse vector must be provided with a corresponding order vector. An order vector consists essentially of a series of bits, one bit for each operand of a normal unpacked vector. The state of the bit is either zero or one. Zero indicates that the correspondingly ordered operand of the vector is deleted. One indicates that the correspondingly ordered operand of the vector is present. Only those operands corresponding to the one-bits, therefore, will be actually stored in memory.

In the prior art, such as with U.S. Pat. No. 3,919,534 to Hutson, et al., the order vector was inspected essentially one bit at a time. When a one-bit was encountered, the operand first in line was forwarded to the ALU for processing. But when a zero bit was encountered, an operand was not forwarded. With two vectors being simultaneously coprocessed, a one-bit in either order vector caused the forwarding of at least the operand from the sparse vector in which the order vector had a one-bit. If the other order vector had a zero-bit, a zero valued operand was inserted and forwarded instead of the operand at the head of the line.

The apparatus of FIG. 1 modifies this procedure by inspecting a group of eight order bits at a time. (In this regard, eight is an arbitrary number. The actual number of bits inspected can be arbitrarily chosen as may be appreciated by those skilled in the art.) Operands of a preselected value, such as zero are inserted into the operand stream coming from memory according to the occurrence of zeros in the order vector. The resulting expanded or unpacked eight operands are forwarded in parallel to the ALU for simultaneous tandem processing. An ALU such as found in the CDC CYBER 205 has the capability of processing eight operands in tandem.

If every bit of the order vector is a one signifying that eight non-zero operands are to be forwarded to the ALU, an increase in speed of up to eight times is achieved over the prior art method of forwarding one operand at a time to the ALU.

Sparse vector operands are fetched from memory by apparatus not shown and forwarded through interconnected eight-operand registers R1, R2 and R3, respectively, such that operands $A_0$ through $A_7$ (assuming in this example that the sparse vector has no zero valued operands) are located in R3, $A_8$ to $A_{15}$ in R2 and $A_{16}$ to $A_{23}$ in R1.

As the sparse vector operands are being loaded into registers R1 through R3, the sparse vector's corresponding order vector is loaded eight bits at a time into register X0. Each machine cycle, eight more bits are loaded into register X0 until all order vector bits have been loaded. Likewise, each machine cycle the contents of register X0 are copied by interconnected register X2 and also are provided as an input to a one-bit population counter EP1. The results of the population count, which may range from a count of 0 to a count of 8, are loaded into a four bit register X1 during the same machine cycle.

On the third machine cycle, the contents of register X2 are loaded into interconnected register X3. The four-bit count of register X1 is provided as one input to adder A1. The other input to adder A1 is provided by three bits from register SC1, which is initialized to a starting shift count determined by a programmer. A bias of 0 is provided as the fourth bit to this adder input. The three-bit output of adder A1 is loaded into three-bit register SC1 during the machine cycle. Also, a carry bit is loaded into carry register C1. The three-bit limitation on the adder's output provides that any addition having a result higher than the number seven has a carry input to carry register C1. The lower order three bits of a resultant are input to register SC1. Also during this machine cycle, interconnected register SC2 copies the contents of register SC1.

At the end of three machine cycles, register X3 contains the first group of eight bits of the order vector; SC1 has the three bit count of the number of 1 bits in that first group of order-vector bits plus the starting shift count, and register SC2 contains the starting shift count.

On the fourth machine cycle, the eight bits of register X3 are provided as inputs to expansion network E1. Also provided as inputs are eight outputs of shift network 10. The shift network receives fifteen operands: eight from register R3 and seven from R2. It shifts these operands to its eight outputs according to the count in register SC2, which on the fourth machine cycle contains the starting shift count. The expansion network E1 also receives preset data operands, normally a value of zero, from the preset data line. The expansion network arranges the two sets of operand inputs according to the arrangement of order vector bits contained in register X3.

For example, assume the starting shift count is zero and the initial eight bits of the order vector are 10011011, the leftmost list corresponding to $A_0$. Register R3 then contains in its lowest ordered cells sparse vector operands as follows:

$A_0, A_3, A_4, A_6, A_7$ $R3_0, R3_1, R3_2, R3_3, R3_4$.

The expansion network E1 inspects the lowest order bit from the order vector bits in X3 and, finding it to be a one, places operand $A_0$ from register R3 on its lowest order output. It inspects the next highest order bit from register X3 and, finding it to be a zero, places a preset data operand (0) on the second lowest order output, and so on, until the expansion network's eight outputs are as follows:

$A_0, 0, 0, A_3, A_4, 0, A_6, A_7$.

These eight outputs are simultaneously provided as inputs to the ALU for tandem processing.

During the next machine cycle, the fifth, the contents of register SC1, which is the count of the number of one-bits in the first group of eight order-vector bits, is loaded into register SC2. The output of register SC2 causes the shift network 10 to point to R3 cell address 5 for our example in which the number of one-bits in the first group of order-vector bits is five. By "point to", it is meant that the shift network shifts R3 cells 5, 6, and 7, and R2 cells 0, 1, 2, 3 and 4 into its eight outputs.

The second group of eight order bits is copied during this same machine cycle into register X3. Assuming the second group of order vector bits contains the following pattern: 01011101, the operands present in the shift network outputs (in part) will have originated from the fifth order R3 cell to the second order R2 cell as follows:

$A_9, A_{11}, A_{12}, A_{13}, A_{15}$ $R3_5, R3_6, R3_7, R2_0, R2_1$.

The expansion network E1 places these five operands on its outputs according to the pattern of order vector bits in register X3: 01011101. Thus the E1 outputs at the end of the fifth cycle will be $0, A_9, 0, A_{11}, A_{12}, A_{13}, 0, A_{15}$. These eight operands are forwarded in parallel for tandem coprocessing by the ALU.

The contents of SC1 in the previous machine cycle, cycle number four, was the number five reflective of five one-bits present in the first group of order vector bits. In addition to this count being loaded into SC2 for control of shift network 10, it is also fed back as the second input to adder A1, as explained supra. The second group of order-vector bits also had five one-bits. Thus the population counter EP1 will have forwarded a count of five to the first input to adder A1. The addition of these two count-of-five inputs causes the adder to place on its output the number 2 with a carry. The three lower most order bits have a bit-pattern 010 and are forwarded to the register SC1. The carry is forwarded to carry register C1.

During the fifth machine cycle, the presence of a 1 bit in the carry register causes register R3 to copy the contents of register R2, register R2 to copy the contents of register R1 and register R1 to load a new group of eight sparse vector operands.

Assuming the third and fourth groups of order vector bits are all ones, the contents of register R3 and R2, after this move, will appear as follows:

$A_{13}, A_{15}, A_{16} \ldots A_{29}$ $R3_0, R3_1, R3_2, \ldots R2_7$.

During this same machine cycle the contents of register SC1, 010, is loaded into register SC2. During the next machine cycle shift network 10 will thus point to $R3_2$, the second lowest order cell of register R3, which correctly contains the next sparse vector operand to be processed, $A_{16}$.

The process continues as such until each operand of the sparse vector has been forwarded to the ALU.

With more particularity, if the order vector inputs to expansion network E1 are denoted by $Z_0, Z_1 \ldots Z_n$, the eight operand inputs from shift network 10 denoted by $A, A_1, \ldots A_n$, the expansion network's outputs denoted by $O_0, O_1, \ldots O_n$, and B=preset data, the following logic equations describe the operation of expansion network E1.

$$C_{00} = A_0\overline{Z_0} + A_1Z_0$$

$$C_{10} = A_1\overline{Z_0} + A_2Z_0$$

$$C_{20} = A_2\overline{Z_0} + A_3Z_0$$

-continued $$C_{30} = A_3\bar{Z}_0 + A_4Z_0$$
$$C_{40} = A_4\bar{Z}_0 + A_5Z_0$$
$$C_{50} = A_5\bar{Z}_0 + A_6Z_0$$
$$C_{60} = A_6\bar{Z}_0 + A_7Z_0$$
$$C_{01} = C_{00}\bar{Z}_1 + C_{10}Z_1$$
$$C_{11} = C_{10}\bar{Z}_1 + C_{20}Z_1$$
$$C_{21} = C_{20}\bar{Z}_1 + C_{30}Z_1$$
$$C_{31} = C_{30}\bar{Z}_1 + C_{40}Z_1$$
$$C_{41} = C_{40}\bar{Z}_1 + C_{50}Z_1$$
$$C_{51} = C_{50}\bar{Z}_1 + C_{60}Z_1$$
$$C_{02} = C_{01}\bar{Z}_2 + C_{11}Z_2$$
$$C_{12} = C_{11}\bar{Z}_2 + C_{21}Z_2$$
$$C_{22} = C_{21}\bar{Z}_2 + C_{31}Z_2$$
$$C_{32} = C_{31}\bar{Z}_2 + C_{41}Z_2$$
$$C_{42} = C_{41}\bar{Z}_2 + C_{51}Z_2$$
$$C_{03} = C_{02}\bar{Z}_3 + C_{12}Z_3$$
$$C_{13} = C_{12}\bar{Z}_3 + C_{22}Z_3$$
$$C_{23} = C_{22}\bar{Z}_3 + C_{32}Z_3$$
$$C_{33} = C_{32}\bar{Z}_3 + C_{42}Z_3$$
$$C_{04} = C_{03}\bar{Z}_4 + C_{13}Z_4$$
$$C_{14} = C_{13}\bar{Z}_4 + C_{23}Z_4$$
$$C_{24} = C_{23}\bar{Z}_4 + C_{33}Z_4$$
$$C_{05} = C_{04}\bar{Z}_5 + C_{14}Z_5$$
$$C_{15} = C_{14}\bar{Z}_5 + C_{24}Z_5$$
$$C_{06} = C_{05}\bar{Z}_6 + C_{15}Z_6$$
$$O_0 = B\bar{Z}_0 + A_0Z_0$$
$$O_1 = B\bar{Z}_1 + C_{00}Z_1$$
$$O_2 = B\bar{Z}_2 + C_{01}Z_2$$
$$O_3 = B\bar{Z}_3 + C_{02}Z_3$$
$$O_4 = B\bar{Z}_4 + C_{03}Z_4$$
$$O_5 = B\bar{Z}_5 + C_{04}Z_5$$
$$O_6 = B\bar{Z}_6 + C_{05}Z_6$$
$$O_7 = B\bar{Z}_7 + C_{06}Z_7$$

It will be recognized by those skilled in the art that the above logic equations may best be implemented bit by bit on the respective operands A and B.

The ALU receives the operands n pairs at a time and performs n arithmetic or logic operations thereon in tandem. After having performed these functions, the ALU outputs n resultants per machine cycle. Some of those resultants may have a value of zero or an invalid result in the case of a divide by zero. It is desirable to store these resultants in memory with the zero or invalid resultants deleted. The apparatus for performing such deletions is illustrated in FIG. 2.

Each machine cycle operands from a first expanded vector are stored in n-operand register R4. Likewise operands from a second expanded vector are stored in n-operand register R24. The ALU loads the operands from these registers, performs n tandem logical or arithmetic operations thereon and stores the n resultants in n-resultant register R5. These n resultants are then compressed into sparse vector format during the next machine cycle by compress network CR1, which will be hereinafter more fully described. The compressed resultants are stored in register R6. The number of resultants stored in R6 depends on the number of valid resultants (zero or invalid resultants deleted) present in the group of n resultants. These resultants are then forwarded to memory via downstream apparatus not shown.

The determination of which resultants are valid and which are zero or invalid is made according to a logical combination of the order vectors for the two sparse vectors, one of which is labeled the X order vector and the other of which is labeled the Y order vector. For example, if the operation to be performed on the two sparse vectors is an add or a subtract operation, the resultant vector will have a valid resultant for a given order whenever one of the input vectors had a valid operand in that order. If order vector X comprises 10000110 and order vector Y comprises 01001010, a resultant order vector Z will appear 11001110, a one corresponding to a valid resultant. This Z order vector is the logical "OR" of the X and Y order vectors. Likewise, if the operation is a multiply or a divide, the resultant order vector Z would appear 00000010, which is the logical "AND" of the X and Y order vector. Similar logical manipulation may be performed on the X and Y order vector to find a resultant order vector for any logical or arithmetic operation performed by the ALU.

Figure 2:
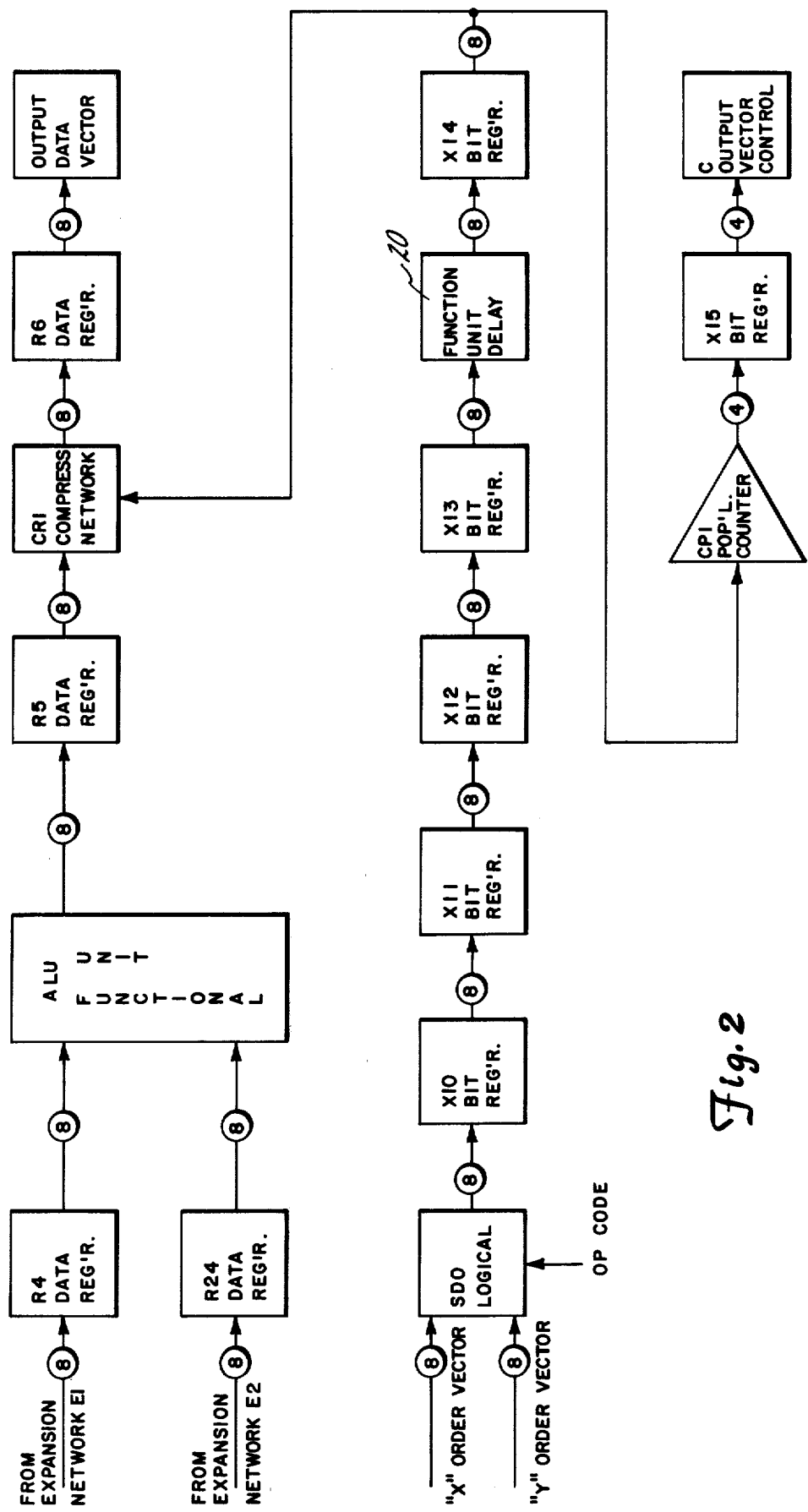
FIG. 2 shows a schematic of a circuit to compress tandem resultants from an ALU into a sparse vector.

In FIG. 2, this logical operation is performed in block SDO, which has as inputs the two operand order vectors X and Y, as well as an indication of the function or op-code to be performed by the ALU. Block SDO receives the two order vectors, eight bits each machine cycle, and stores the results in register X10.

Register X10 through X13 are delay registers which delay the resultant order vector Z the number of machine cycles as the input sparse vector operands need to pass through registers R1, R2, R3 and R4.

The output from register X13 is stored in register X14. But, as the transfer between these two registers occurs during the same period of time the operands are being processed by the ALU, the transfer is delayed by functional unit delay 20 to synchronize the arrival of Z order vector bits in X14 with the arrival of resultants in register R5. The time of the delay depends upon the logical or arithmetic operation being performed by the ALU.

The contents of register X14 are provided as one input to compress network CR1. They are also provided as the input to population counter CP1, which counts the number of one bits therein. This count, representative of the number of valid operands in R5, is forwarded to four-bit register X15. Register X15's output is provided to downstream circuitry to indicate the number of valid sparse vector resultants that are available in register R6 for storage in memory.

The operation of compress network CR1 is illustrated by the following example. Assuming the resultant order vector Z from register R14 comprises the bit pattern 10101101, the resultants present in register R5, $r_0$, $r_1$, $r_2$ ... $r_8$ will be compressed and stored, left justified, into register R6 as follows: $r_0$, $r_2$, $r_4$, $r_5$, $r_7$, 0, 0, 0. $r_1$, $r_3$ and $r_6$, which correspond to zeroes in the Z order vector, have been deleted.

The logic equations for compress network CR1, where $Z_0$ through $Z_7$ represent resultant order vector bits input from register X14, $A_0$, $A_1$, $A_2$, ... $A_7$ represent resultants input from register R5 and $r_0$, $r_1$, $r_2$ ... $r_7$ represent the output of compress network CR1, comprise the following:

$$C_{70} = A_7 Z_7$$
$$C_{60} = A_6 Z_6$$
$$C_{50} = A_5 Z_5$$
$$C_{40} = A_4 Z_4$$
$$C_{30} = A_3 Z_3$$
$$C_{20} = A_2 Z_2$$
$$C_{10} = A_1 Z_1$$
$$C_{00} = A_0 Z_0$$
$$C_{71} = C_{70} Z_6$$
$$C_{61} = C_{70}\bar{Z}_6 + C_{60}$$
$$C_{72} = C_{71} Z_5$$
$$C_{62} = C_{71}\bar{Z}_5 + C_{61} Z_5$$
$$C_{52} = C_{61}\bar{Z}_5 + C_{50}$$
$$C_{73} = C_{72} Z_4$$
$$C_{63} = C_{72}\bar{Z}_4 + C_{62} Z_4$$
$$C_{53} = C_{62}\bar{Z}_4 + C_{52} Z_4$$
$$C_{43} = C_{52}\bar{Z}_4 + C_{40}$$
$$C_{74} = C_{73} Z_3$$
$$C_{64} = C_{73}\bar{Z}_3 + C_{63} Z_3$$
$$C_{54} = C_{63}\bar{Z}_3 + C_{53} Z_3$$
$$C_{44} = C_{53}\bar{Z}_3 + C_{43} Z_3$$
$$C_{34} = C_{43}\bar{Z}_3 + C_{30}$$
$$C_{75} = C_{74} Z_2$$
$$C_{65} = C_{74}\bar{Z}_2 + C_{64} Z_2$$
$$C_{55} = C_{64}\bar{Z}_2 + C_{54} Z_2$$
$$C_{45} = C_{54}\bar{Z}_2 + C_{44} Z_2$$
$$C_{35} = C_{44}\bar{Z}_2 + C_{34} Z_2$$
$$C_{25} = C_{34}\bar{Z}_2 + C_{20}$$
$$C_{76} = C_{75} Z_1$$
$$C_{66} = C_{75}\bar{Z}_1 + C_{65} Z_1$$
$$C_{56} = C_{65}\bar{Z}_1 + C_{55} Z_1$$
$$C_{46} = C_{55}\bar{Z}_1 + C_{45} Z_1$$
$$C_{36} = C_{45}\bar{Z}_1 + C_{35} Z_1$$
$$C_{26} = C_{35}\bar{Z}_1 + C_{25} Z_1$$
$$C_{16} = C_{25}\bar{Z}_1 + C_{10}$$
$$r_7 = C_{77} = C_{76} Z_0$$
$$r_6 = C_{67} = C_{76}\bar{Z}_0 + C_{66} Z_0$$
$$r_5 = C_{57} = C_{66}\bar{Z}_0 + C_{56} Z_0$$
$$r_4 = C_{47} = C_{56}\bar{Z}_0 + C_{46} Z_0$$
$$r_3 = C_{37} = C_{46}\bar{Z}_0 + C_{36} Z_0$$

-continued $$r_2 = C_{27} = C_{36}\bar{Z}_0 + C_{26} Z_0$$
$$r_1 = C_{17} = C_{26}\bar{Z}_0 + C_{16} Z_0$$
$$r_0 = C_{07} = C_{16}\bar{Z}_0 + C_{00}$$

The above sets of equations imply the use of two-way OR's. The preferred embodiment actually uses four-way OR's. Those skilled in the art should modify the above equations when implementing the logic with four-way OR's to produce equivalent four-way OR logic.

While not illustrated, those skilled in the art will appreciate that a substitution of one-bits for the Z order vector bits will result in every resultant in register R5 being transferred undisturbed to register R6 and thence to memory. The resultant vector stored in memory under these circumstances would be in the expanded, uncompressed format. These one-bits may conveniently be introduced at register X10. If only one sparse vector is introduced and the ALU op-code is a NO-OP, the net result is that a sparse vector is converted to an expanded vector.

Likewise, if the vector or vectors in memory to be processed by the ALU are already in their expanded format (and maybe not even possessing an order vector), a group of one-bits input to register $X_0$ of FIG. 1 in lieu of the order vector bits results in no expansion in network EP1. In this manner, an expanded vector or vectors may be processed and compressed. If only one is input and the ALU op-code is a NO-OP, the net result is that the expanded vector is compressed into a sparse vector.

If one bits are substituted at both X0 and X10, one or more expanded vectors may be processed by the disclosed apparatus.

Other similar modifications are likely to occur to those skilled in the art.

The enumeration of specific elements of the preferred embodiment is not by limitation on the scope and spirit of the appended claims, in which we claim:

1. In a computer having an arithmetic logic unit capable of processing at least one predetermined number of operands in tandem, said computer further adapted to process sparse vectors, said sparse vectors having corresponding order vectors having bits of two types, a first type indicative of the location of sparse vector operands in an expanded vector, a second type indicative of the location of operands of a preselected value; for each sparse vector to be coprocessed by said arithmetic logic unit, the improvement comprising:
  means for fetching said order vector bits group by group until all order vector bits have been fetched; the numbers of bits in each group being equal to said predetermined number of operands said arithmetic logic unit is capable of processing in tandem;
  means responsive to said means for fetching order vector bits for developing a population count of the number of bits of said first type in a group of order vector bits;
  means responsive to said means for developing a population count for forwarding a first plurality of operands from said sparse vector equal in number to said population count;
  means for aligning and ordering said first plurality of operands into an expanded group according to the alignment and order of said first type bits in said group of order vector bits;

means for generating operands of a preselected value;

means for inserting said operands of a preselected value into said expanded group according to the alignment and order of said second type bits in said group of order vector bits; and means for forwarding said expanded group of aligned and ordered operands in tandem to said arithmetic logic unit.

2. The improvement of claim 1 further including means for forming an output order vector comprising the logical "OR", in the case of an add or a subtract arithmetic logic unit operation, or for forming the logical "AND", in the case of a multiply or a divide operation, of the order vectors corresponding to the sparse vectors added, subtracted, multiplied or divided by the arithmetic logic unit;

means for developing a count of the number of bits in a group of said output order vector bits indicative of the presence of valid sparse vector resultants in the output of said arithmetic logic unit, the total number of bits in said group being equal to said predetermined number of operands said arithmetic logic unit is capable of processing in tandem;

means for receiving an output of said predetermined number of resultants from said arithmetic logic unit and for extracting those resultants aligned and ordered according to the alignment and order of said output order vector bits indicative of valid sparse vector resultants; and means for forwarding said extracted resultants to an output, the number forwarded being equal to said count.

3. The improvement of claim 2 further including means for selectively substituting all one bits in lieu of either said order vector bits or said output order vector bits, or both whereby expanded format vectors may be selectively input to, output from or both input to and output from said tandem processing arithmetic logic unit.

4. The improvement of claim 1 wherein said means for forwarding a first plurality of operands from said sparse vector comprises:

a first register means for loading, holding and outputting on outputs said predetermined number of operands;

a second register means for loading, holding and outputting on outputs said predetermined number of operands;

a shift network means for shifting a number of consecutively ordered inputs to an equal number of outputs from a group of ordered inputs comprising in the lowest order the outputs of said first register means and in the highest order at least all but the highest order of the outputs of said second register means, the lowest ordered input to be shifted indicated by a shift count input, the number shifted being said predetermined number, said shifted outputs comprising the forwarded operands;

shift count register means for holding and outputting on outputs a shift count, the outputs having means for interconnection to said shift count input of said shift network means;

adder means for adding together said population count and the shift count present in said shift count register means to form on a first adder output the lowest order bits of said sum, the maximum count of which is one less than said predetermined number, and on a second adder output a carry when said sum equals or exceeds said predetermined number;

means for moving said first adder output into said shift count register means after said aligned and ordered operands have been forwarded to said arithmetic logic unit;

means interconnected to said second adder output for moving in response to the presence of a carry the operands present in said second register means into said first register means and for loading a new group of said predetermined number of sparse vector operands into said second register means.

* * * * *